United States Patent [19]

Brors et al.

[11] Patent Number: 4,920,908

[45] Date of Patent: May 1, 1990

[54] METHOD AND APPARATUS FOR DEPOSITION OF TUNGSTEN SILICIDES

[75] Inventors: Daniel L. Brors, Los Altos Hills; James A. Fair, Mountain View; Kenneth A. Monnig, Palo Alto, all of Calif.

[73] Assignee: Genus, Inc., Mountainview, Calif.

[21] Appl. No.: 323,199

[22] Filed: Mar. 13, 1989

Related U.S. Application Data

[60] Continuation of Ser. No. 654,155, Sep. 25, 1984, abandoned, which is a division of Ser. No. 480,030, Mar. 29, 1983, Pat. No. 4,565,157.

[51] Int. Cl.$^5$ ............................................. C23C 16/00
[52] U.S. Cl. .............................. 427/255.2; 427/255.1; 118/719; 118/724; 118/725
[58] Field of Search .......................... 427/255.1, 255.2; 118/719, 724, 725

[56] References Cited

U.S. PATENT DOCUMENTS

| | | | |
|---|---|---|---|
| 2,785,997 | 3/1957 | Marvin | 427/99 |
| 3,460,510 | 4/1969 | Currin | 118/725 |
| 3,645,230 | 2/1972 | Hugle et al. | |
| 3,862,397 | 1/1975 | Anderson | |
| 4,047,496 | 9/1977 | Benzing et al. | |
| 4,089,992 | 5/1978 | Doo et al. | 427/94 |
| 4,258,658 | 3/1981 | Politycki et al. | |
| 4,276,557 | 6/1981 | Levinstein et al. | |
| 4,332,839 | 6/1982 | Levinstein et al. | |
| 4,401,054 | 8/1983 | Matsuo et al. | 118/724 X |

OTHER PUBLICATIONS

"A CVD Study of the Tungsten Silicon System", by J. Lo, R. W. Haskell, J. G. Byrne, and A. Sosin, *Proceedings of the 4th International Conference on CVD*, (Electrochem. Svc., Princeton, N.J.), pp. 74–63.

"Vapor Deposition of Tungsten by Hydrogen Reduction of Tungsten Hexaflouride, " by Jean F. Berkeley, Abner Brenner, and Walter E. Reide, Jr., J. Electrochem. Society: Electrochemical Science, Jun. 1967.

"Formation of $W_xSi_{1-x}$ by Plasma Chemical Vapor Deposition", by K. Watanake, Appl. Phys. Lett. 39(5), 1 Sep. 1981, pp. 445–447.

"Low Temperature LPCVD of Tantalum Silicide," by William I. Lehrer et al., *VLSI Science and Technology*, Proceedings of the First International Symposium on Very Large Scale Integration Science and Technology, Electrochem. Soc., vol. 82–87.

"Kinetics of Tungsten Deposition by the Reaction of $WF_6$ and Hydrogen, " by W. A. Bryant, J. Electrochem. Soc., Solid State Science and Technology, vol. 125, No. 9, Sep. 1978, pp. 1534–1543.

"Selective-Chemical Vapor Deposition of Tungsten," by Jerome J. Cuomo, Proc. of the 3rd International Conf. on Chemical Vapor Deposition, 1972.

"General Relationship for the Thermal Oxidation of Silicon", by B. E. Deal and A. S. Grove, J. Appl. Phys., vol. 36, No. 12, Dec. 1965, pp. 3770–3778.

(List continued on next page.)

*Primary Examiner*—Richard Bueker
*Attorney, Agent, or Firm*—Finnegan, Henderson, Farabow, Garrett & Dunner

[57] ABSTRACT

An apparatus is provided for obtaining very high quality films by chemical vapor deposition in situations where the deposition is mass transport limited. In accordance with the preferred embodiments, there is provided a vacuum housing which is actively cooled to a temperature below which deposition occurs, while at the same time the wafers are being heated to cause deposition at the wafer surfaces. Also provided are mixing chamber systems to ensure that reactant gases are well mixed and distributed evenly over each wafer surface. Mass transport control is further enhanced by providing an exhaust manifold which scavenges reactant gases from locations distributed throughout the system to achieve an even exhaust. Also provided is a method for depositing silicon-rich tungsten silicides using the above apparatus.

1 Claim, 4 Drawing Sheets

OTHER PUBLICATIONS

"Interface Effects in the Formation of Silicon Oxide on Metal Silicide Layers Over Silicon Substrates", by J. E. E. Baglin, F. M. D'Heurle, and C. S. Petersson, J. Appl. Phys., vol. 54, No. 4, Apr. 1983, pp. 1849–1854.

"The Influence of Noble Gas Atoms on The Epitaxial Growth of Implanted and Sputtered Amorphous Silicon", by M. Wittner, J. Roth and W. Mayer, J. Electrochem. Soc., vol. 126, No. 7, Jul. 1979, pp. 1247–1252.

"Silicides for Interconnection Technology," by Farrokh Mohammadi, Solid State Technology, vol. 24:1, Jan. 1981, pp. 65–72.

"The Evolution of Digital Electronics Towards VLSI," by Robert W. Keyes, IEEE Trans. on Electron Devices, vol. 26, No. 4, Apr. 1979, pp. 271–178.

"Metal Silicon Reactions Induced by CW Scanned Laser and Electron Beams," by T. Shibata, T. W. Sigmon, J. L. Regolini, and J. F. Gibbons, J. Electrochem. Soc., vol. 128, No. 3, Mar. 1981, pp. 637–644.

"Observations on the Hexagonal Form of $MoSi_2$ and $WSi_2$ Films Produced by Ion Implantation and On Related Snowplow Effects", by F. M. d'Heurle, C. S. Petersson and M. Y. Tsai, J. Appl. Phys., vol. 51, No. 11, Nov. 1980, pp. 5976–5980.

"Speed Limitations Due to Interconnect Time Constants in VLSI Integrated Circuits", by A. K. Sinha, J. A. Cooper, Jr. and H. J. Levinstein, IEEE Electron Device Letters, vol. EDL-3, No. 4, Apr. 1982, pp. 90–92.

"A Quasi-Static Technique for MOS C–V and Surface State Measurements," by M. Kuhn, Solid-State Electronics, vol. 13, 1970, pp. 873–885.

"Properties of Molybdenum Silicide Film Deposited by Chemical Vapor Deposition," by S. Inoue, N. Toyokura and T. Nakamura, M. Maeda and M. Takagi, vol. 130, No. 7, Jul. 1983, pp. 1603–1607.

"The $Si-WSi_2-Si$ Epitaxial Structure," by Norikazu Hashimoto and Yasushi Koga, J. Electrochem. Soc. 114(11), pp. 1189–1191, (1967).

"Chemical Vapour Deposition of the Silicides of Molybdenum, Niobium and Tantalum," by Dietrick E. R. Kehr, Proc. of the 6th International Conference of Chemical Vapor Deposition, (1977).

"Low Pressure Chemical Vapor Deposition of Polysilicon", by R. J. Geiske et al., Proc. of the 6th International Conference on Chemical Vapor Deposition, (1977).

"Oxidation Induced Voids in Polysilicon/Silicide Films", by N. Hsieh and L. A. Nesbit, Extended Abstracts, Abstract No. 161, Electrochem. Soc., (Spring 1980).

"Controlling Grain Orientation in CVD Tungsten", by Fred A. Glaski, Proc. of 2nd International Conference on Chemical Vapor Deposition, (1970).

"Silicide Formation in Tungsten and Other Refractory Metallizations on PtSi on Silicon", by A. K. Shinha et al., J. Electrochem. Soc.: Solid State Science and Technology, (Dec. 1973).

"Thermal Decomposition of $W(CO)_6$ for Tungsten Semiconductor Metallizations", by Michael Fisk and Jon Goldman, Termco Technical Bulletin, Thermco Products Corp., received by Genus, Inc., Jun. 9, 1982.

"Plasma-Enhanced Deposition of Tungsten, Molybdenum, and Tungsten Silicide Films", by C. C. Tang et al., Solid State Technology, (Mar. 1983).

"Refractory Silicides of Titanium and Tantalum for Low-Resistivity Gates and Interconnects", by Shyam P. Murarka et al., IEEE Transactions on Electron Devices, vol. ED-27, No. 8, Aug. 1980.

"Refractory Silicides for Low Resistivity Gates and Interconnects", by S. P. Murarka, IEEE Abstracts, Dec. 1979.

"Silicon–Molybdenum Interaction: CVD Silicon on Molybdenum", by M. J. Rice, Jr. and K. R. Sarma, Extended Abstracts, Abstract No. 182, The Electrochem. Soc., (Spring 1980).

"Plasma-enhanced Chemical Vapor Deposition of Tungsten Films", by J. K. Chu et al., Appl. Phys. Lett. 41(1), 1 Jul. 1982.

"Studies of Steam-Oxidized $WSi_2$ by Auger Sputter Profiling", by J. Rouse et al., Appl. Phys. Lett. 37(3), 1 Aug. 1980.

"Properties of Tungsten Silicide Film on Polycrystalline Silicon", by M. Y. Tsai et al., J. Appl. Phys. 52(8), Aug. 1981.

"1 $\mu$m MOSFET VLSI Technology: Part VII—Metal Silicide Interconnection Technology—A Future Perspective", by Billy L. Crowder and Stanley Zirinsky, IEEE Transactions on Electronic Devices, vol. ED-76, No. 4, Apr. 1979.

(List continued on next page.)

OTHER PUBLICATIONS

"Material Properties of Silicides and Device Technology Implications", by F. M. d'Heurle, VLSI Science and Technology, (1982).

"A New MOS Process Using $MoSi_2$ as a Gate Material", by Tohru Mochizuki et al., Proc. 9th Conf. on Solid State Devices, Tokyo, 1977.

"Properties of Molybdenum Silicide Film Deposited by Chemical Vapor Deposition", by S. Inoue et al., IEEE Trans. Electron Devices, vol. ED-27, No. 8, Aug. 1980.

"MOS Compatibility of High-Conductivity $TaSi_2/n^+$ Poly Si Gates", by Ashok K. Sinha, IEEE Transactions on Electron Devices, vol. ED-27, No. 8, Aug. 1980.

"Composite Silicide Gate Electrodes—Interconnections for VLSI Device Technologies", by Henry J. Geipel, Jr. et al., IEEE Transactions on Electron Devices, vol. ED-27, No. 8, Aug. 1980.

"Film Properties of $MoSi_2$ and their Application to Self-Aligned $MoSi_2$ Gate MOSFET", by Tohru Mochizuki et al., IEEE Transactions on Electron Devices, vol. ED-27, No. 8, Aug. 1980.

"Effect of Temperature and Substrate on the Steam Oxidation Mechanism of Thin $WSi_2$ Films", by F. Mohammadi et al., Abstract No. 160, Extended Abstracts 157th Meeting, Electrochem. Soc., vol. 80-1, May 1980.

"Silicides: Which, Why and How?", by S. P. Murarka, Semiconductor Silicon, vol. 81, No. 5, p. 551, (1981).

"Thermal Oxidation of Tantalum Silicide in $O_2$ and $H_2O$", by Krishna C. Saraswat et al., Appl. Phys. Lett. 41(12), 15 Dec. 1982.

"Kinetics of Thermal Oxidation of $WSi_2$", by F. Mohammadi et al, Appl. Physics Lett. 35(71), 1 Oct. 1979.

"Effect of Scaling of Interconnections on the Time Delay of VLSI Circuits", by Krishma C. Saraswat and Farrokh Mohammadi, IEEE Transactions on Electroon Devices, vol. ED-29, No. 4, Apr. 1982.

"Properties of Sputtered Tungsten Silicide for MOS Integrated Circuit Applications", by F. Mohammadi and K. C. Saraswat, J. Electrochem. Soc., vol. 127, No. 2, Feb. 1980.

"$WSi_2$ Gate MOS Devices", by K. C. Saraswat et al., International Electron Devices Meeting, Dec., 1979.

"Photoelectric Measurement of Tungsten Silicide and n-type Silicon Barriers", by Yokichi Itoh and Norikazu Hashimoto, Communications, 1967.

"Reaction-Process Dependence of Barrier Height between Tungsten Silicide and n-type Silicon", by Yokichi Itoh and Norikazu Hashimoto, Communications, 1969.

"Low Temperature CVD Growth of Tungsten Disilicide", by W. I. Lehrer and J. M. Pierce, in Semiconductor Silicon, 1981, vol. 81-5, The Electrochemical Society.

"Low Frequency Planar Plasma Etching of Polycide Structures in an $SF_6$ Glow Discharge", by M. E. Coe and S. H. Rogers, in Solid State Technology, Aug. 1982.

"Kinetics of $WSi_2$ Growth on Silicon", by Korikazu Hashimoto, Transactions of the Metallurgical Society of the AIME, vol. 239, Jul 1967.

METHOD AND APPARATUS FOR DEPOSITION OF TUNGSTEN SILICIDES

This application is a continuation of application Ser. No. 654,155, filed Sep. 25, 1984, now abandoned, which is a division of application Ser. No. 480,030, filed Mar. 29, 1983, now U.S. Pat. No. 5,565,157.

TECHNICAL FIELD

This invention relates to methods and apparatus for low pressure chemical vapor deposition, and more particularly to the low pressure CVD of tungsten silicides.

BACKGROUND OF THE INVENTION

Advances in the reduction of device geometries of integrated circuits has created a high demand for improved microfabrication techniques and materials. Presently available processing methods can define dimensions as small as 1 to 1.5 micrometers, and even smaller geometries are desired. Improvements in dry etching and lithography, however, have already reduced the dimensions of high density VLSI circuits to the point where significant impediments to this quest are already apparent.

For example, the use of polycrystalline silicon (poly-Si), the most common gate electrode and interlayer interconnect material in present use in LSI-MOS devices, is a significant problem. Although poly-Si has many desirable properties such as good etchability, good oxidation characteristics, mechanical stability at high temperatures, excellent step coverage and adhesion, it has the major drawback of having a relatively high resistance. For most applications a sheet resistance of 20–30 ohms/square, the typical sheet resistance of a 5000 Angstrom layer of heavily doped poly-Si, is not a major constraint in circuit design. However, for VLSI designs, resistance of this magnitude does become a major constraint, since large VLSI circuits require long thin lines, resulting in unacceptable RC-time constraints and thereby limiting high speed performance at very reduced geometries. As a result, it appears that further improvement in MOS circuit design will depend on the development of more advanced interconnect technology.

As a replacement for poly-Si interconnects, refractory metals and refractory metal silicides appear to be attractive candidates and have been under recent investigation. Refractory metals typically have lower bulk resistance than poly-Si, but generally have poor oxidation characteristics and poor adhesion after annealing. Hence, they have met with limited acceptance a the present time. Silicides, on the other hand, although they have higher bulk resistivities than refractory metals, generally have excellent oxidation resistance and exhibit other properties which make them compatible with I.C. wafer processing. For example, silicides have demonstrated stability over I.C. wafer processing temperatures, good adhesion, good chemical resistance and good dry etching characteristics.

Several approaches have been used to form these silicides, but each has met with significant problems. Co-evaporation has tended to produce films with marginal step coverage and significant strinkage during anneal, the latter causing adhesion problems. Co-sputtered films have resulted in better step coverage but a significant amount of argon is included in the films and there is significant shrinkage during anneal. Sputtered films from pressed silicide targets appear to minimize shrinkage, but oxygen, carbon, and argon contamination have generally resulted in films with inferior properties such as bulk resistivities in excess of 100 microohm cm after anneal.

Although chemical vapor deposition (CVD) has the potential to eliminate all of these problems, with the exception of plasma enhanced CVD, success to date has been rather limited. The reported compounds have exhibited a rough surface and have been columnar, bonded, or modular structures, or have been in the form of dust particles. (See "Formation of WXSil-X by plasma chemical vapor deposition", Appl. Phys. Lett. 39(5), Sept. 1, 1981, by K. Akitmoto ard K. Watanahe.)

For the particular situation of tungsten silicide the deposition typically results from reduction of tungsten hexaflouride in silane in a standard quartz or vycor tube reactor. Generally, reactions at the substrate surface are thought to be as follows:

$SiH_4 \rightarrow Si + 4H$ 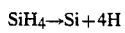

$WF_6 + 6H \rightarrow W + 6HF$ 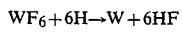

and $W + Si \rightarrow WSi_2$ 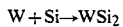

$7W + 3WSi_2 \rightarrow 2W_5Si_3$. 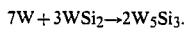

(See "A CVD Study of the Tungsten-Silicon System", by Jyh-Shuey Lo, et al., Proc. of the 4th International Conference on CVD, pp 74–83.) Also, in most hot wall systems some gas phase reactions are likely as well, and can cause serious deleterious effects, particularly formation of dust particles which can contaminate the wafers.

Part of the problem in depositing these silicides in a thermally driven process stems from the very reactive nature of silane in tungsten hexaflouride, and leads to very high surface reaction rates. In addition, the stoichiometry of compounds formed has tended to be rich in tungsten, and therefore unstable when subjected to subsequent processing ambients. The reactions proceed very quickly and at reduced deposition temperatures, so that the results are difficult to control both as to thickness and uniformity. Furthermore, they proceed not just on the desired substrate surfaces, but on other available surfaces in the reaction chamber, making control even more difficult and eventually contributing particulates which can contaminate the wafers on which deposition is desired.

SUMMARY OF THE INVENTION

In accordance with the preferred embodiments of the invention, a low pressure CVD system is provided which is made up of cooled vacuum housing containing a substrate turret assembly that is used for holding and heating substrates during deposition. The temperature of the housing and portions of the substrate turret assembly are maintained at temperatures low enough to substantially eliminate deposition on these parts, while at the same time the substrates are heated to cause deposition on the substrate surfaces.

Also provided is an exhaust manifold which extends up into the vacuum housing to achieve an evenly distributed exhaust. In addition, rather than mix the constituent reactant gases in the vacuum housing itself, these gases are first mixed in mixing chambers and are diffused into the housing at low pressure to avoid gas phase reactions. This diffusion takes place from a plurality of locations to achieve an even distribution of reactant gas within the housing. Furthermore, the substrate turret assembly can be rotated during deposition to ensure a uniform exposure of each substrate and ensure consistency from substrate to substrate.

A key result of this combination of elements is that films of very high quality can be produced, particularly films of silicon-rich tungsten silicide. This is due to the fact that the reduced temperature of the housing and turret assembly, in conjunction with the distributed exhaust and gas flow system, enables very precise mass transport control over the deposition process, thereby achieving the desired stoichiometry and uniformity. Part of this control is achieved because the deposition process takes place nearly entirely at the substrate surface rather than in the gas or on other parts of the system, so that changes in process parameters are very directly related to changes in deposition characteristics.

The particular process of depositing high quality films of tungsten silicide is closely tied to the configuration of the apparatus. However, the general operative parameters in this type of system are that the deposition occurs at a substrate temperature of about 350 degrees C., with the flow rate for silane between 20 to 80 times the flow rate for tungsten hexaflouride. The optimum flow rate for tungsten hexaflouride in order to achieve high quality tungsten silicide films is quite low and typically ranges from about 1.7 cc/min to about 2.0 cc/min for each substrate being deposited. During deposition the vacuum pressure is customarily set at about 200 mT.

DETAILED DESCRIPTION OF THE INVENTION

Figure 1A:
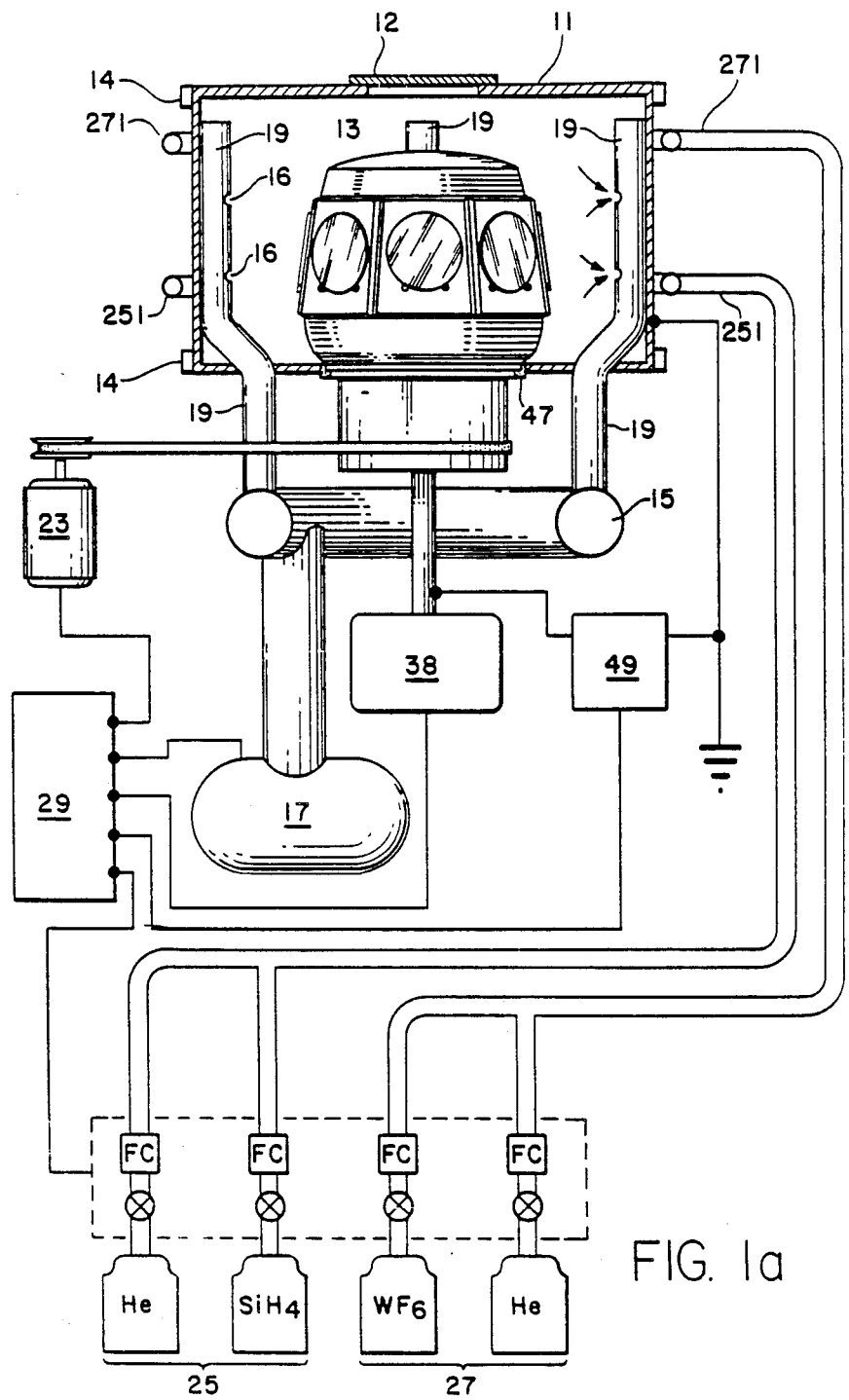
FIG. 1A depicts an low pressure CVD system, and illustrates a cross-section through the vacuum housing of said system.
Figure 1B:
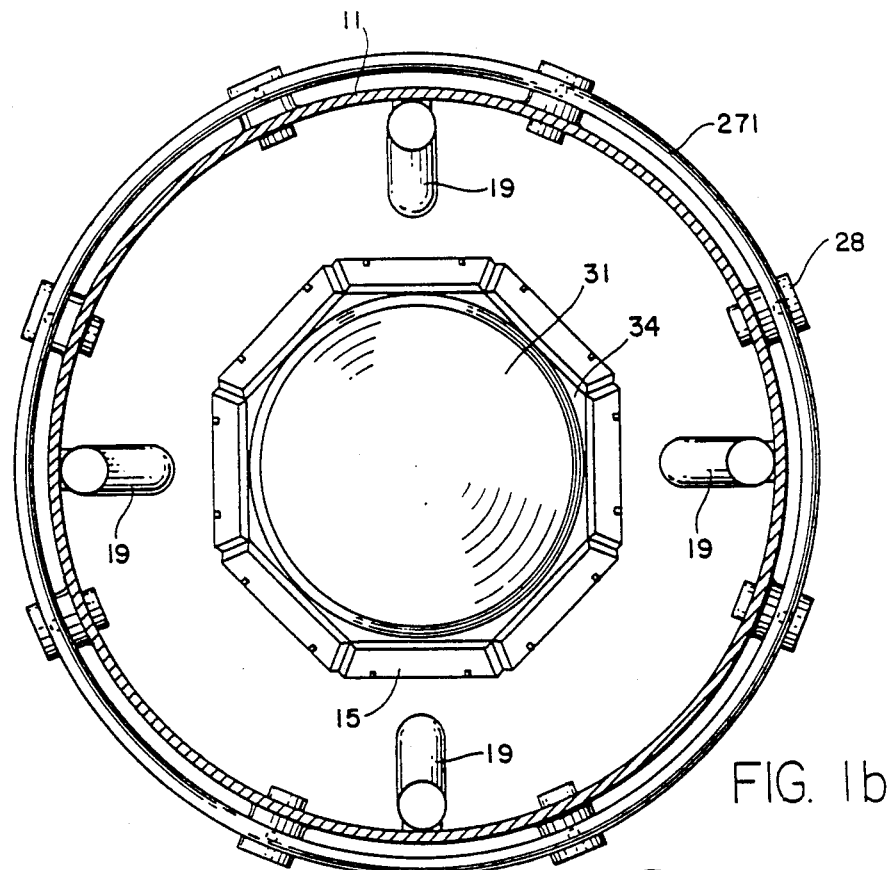
FIG. 1B is a top view of the vacuum housing with the top of the housing removed.

In accordance with the preferred embodiments of the invention, FIGS. 1A and 1B illustrate a barrel-type low pressure CVD reactor system having a cylindrical vacuum chamber, or housing 11, containing a substrate turret assembly 13 at its center for holding wafers during deposition. Typically housing 11 is approximately 60 cm in diameter, having a height of about 30 cm, and is constructed of aluminum with a thickness of approximately 1.5 cm. Aluminum was chosen for its high thermal conductivity and its resistance to corrosion in the presence of the particular reactant gases. The housing includes a locking, vacuum-tight door 12 for introducing wafers into the system and has a circular hole in its floor for accommodating turret assembly 13.

Housing 11 is typically water cooled by cooling coils 14 to a temperature sufficiently low that significant deposition does not occur on the housing inner walls. Generally temperatures for the housing vary depending on the particular materials being deposited, but for tungsten silicides housing temperatures of about 100 degrees C. considerably reduce unwanted deposition on the inner walls. Further decreases in wall temperature to below about 80 degrees C., or more preferably to below 60 degrees C., are even more dramatic. Deposition on the housing walls at these latter temperatures is nearly eliminated, presumably due to the reduced energy available for causing dissociation of the reactants at the wall surface, and due to the fact that generally chemical reactions proceed at a slower rate at reduced temperatures. At 60 degrees C., the deposition on the chamber walls is so minimal that it is quite difficult to measure. Rough estimates appear to indicate that the ratio of the thickness of tungsten silicide deposited on the walls relative to the thickness deposited on the wafers is at most one to a thousand, and is probably even lower.

An exhaust manifold 15 is attached to housing 11 for permitting evacuation of the chamber, exhaust manifold 15 being attached to a vacuum/exhaust system 17 which is typically capable of pumping the system down to less than 10 mT. Exhaust manifold 15 consists of a four-inch (4") diameter, semi-circular, aluminum exhaust plenum which hangs below the housing, with four two-inch (2") diameter connection pipes 19 spaced uniformly around the manifold. These connection pipes extend up into the housing 11 approximately 25 centimeters and make good thermal contact with the housing walls so that the pipes too are maintained at a relatively low temperature. Each connection pipe is capped at the top and has two openings 16, typically about ¾ inches in diameter, one near the top and one near the bottom, so that the housing has a total of eight exhaust ports distributed around its periphery. This arrangement results in a very even exhaust and contributes significantly to achieving control during the deposition process. The vacuum/exhaust system 17 typically includes a vacuum throttle valve and controller, a high accuracy manometer, a rotary vane pump, and a Roots blower to boost the vane pump during pump down and in vacuum maintenance. Vacuum pressure is programmable and is under supervision by microprocessor 29.

Figures 2A, 2B:
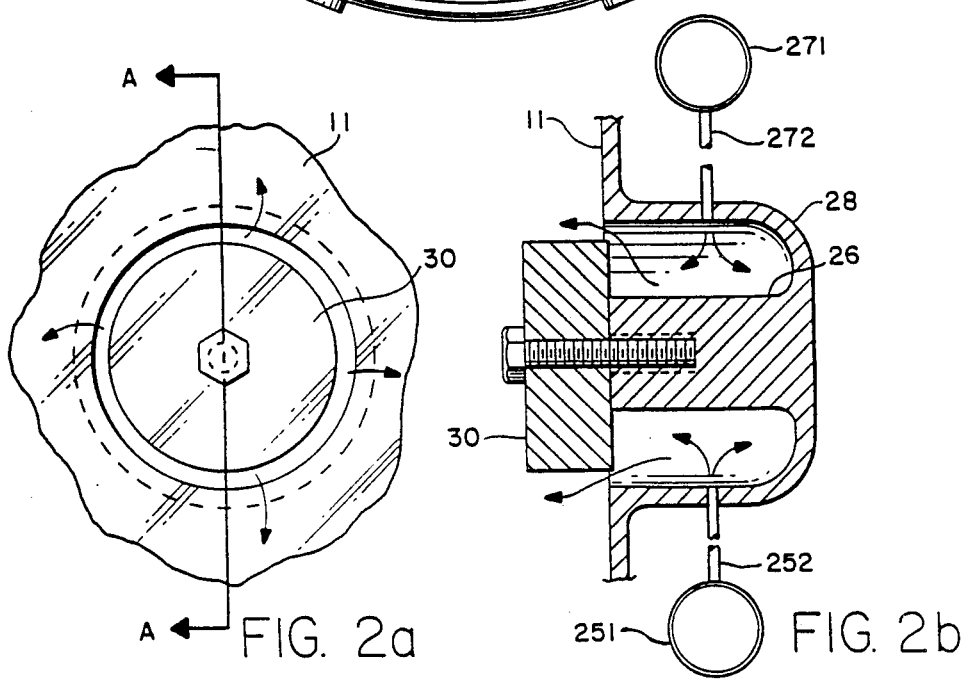
FIG. 2A is a front view of a mixing chamber as it would appear from inside the vacuum housing.
FIG. 2B is a cross-section of the mixing chamber along line A—A.

Reactant gases are typically contained in two banks, a first bank 25 holding process helium and silane, and a second bank 27 holding helium carrier and tungsten hexaflouride. The gases are mixed and diffused at low pressure in a mixing chamber 28 attached to the wall of housing 11 to provide a reactant gas mixture which is introduced into the housing immediately opposite the wafers. The details of mixing chamber 28 are shown in FIGS. 2A and 2B. The mixing chamber is typically circular in cross-section with a diameter usually in the range of 4 to 5 inches and has a center post 26 for holding a circular baffle 30 which serves to distribute the gases uniformly across the wafer. For a 4-inch diameter mixing chamber, a diameter of 3 inches and a thickness of about 1-⅛ inches for baffle 30 is appropriate, with center post 26 being about 3 inches long. Reactant gases are typically carried to the vicinity of chamber 28 from bank 25 and bank 27 by two one-inch pipes, 251 and 271, respectively. The gases then enter the chamber on opposite sides of post 26 through connecting tubes 252 and 272, and are mixed in the chamber before entering the interior of housing 11. To ensure uniform introduction of gases, eight mixing chambers such as chamber 28 are distributed evenly around the housing as shown in FIG.

1B. Tubes 252 and 272 are small in diameter compared to pipes 251 and 271, typically one-sixteenth of an inch, in order to maintain a substantially equal gas pressure at each of the mixing chambers. Gas flow is controlled by microprocessor 29 by means of thermal mass flow controllers designed to ensure precise start-up and flow characteristics (e.g., Unit Instrument Inc., Mass Flow Controller UFC-1000).

Figure 3:
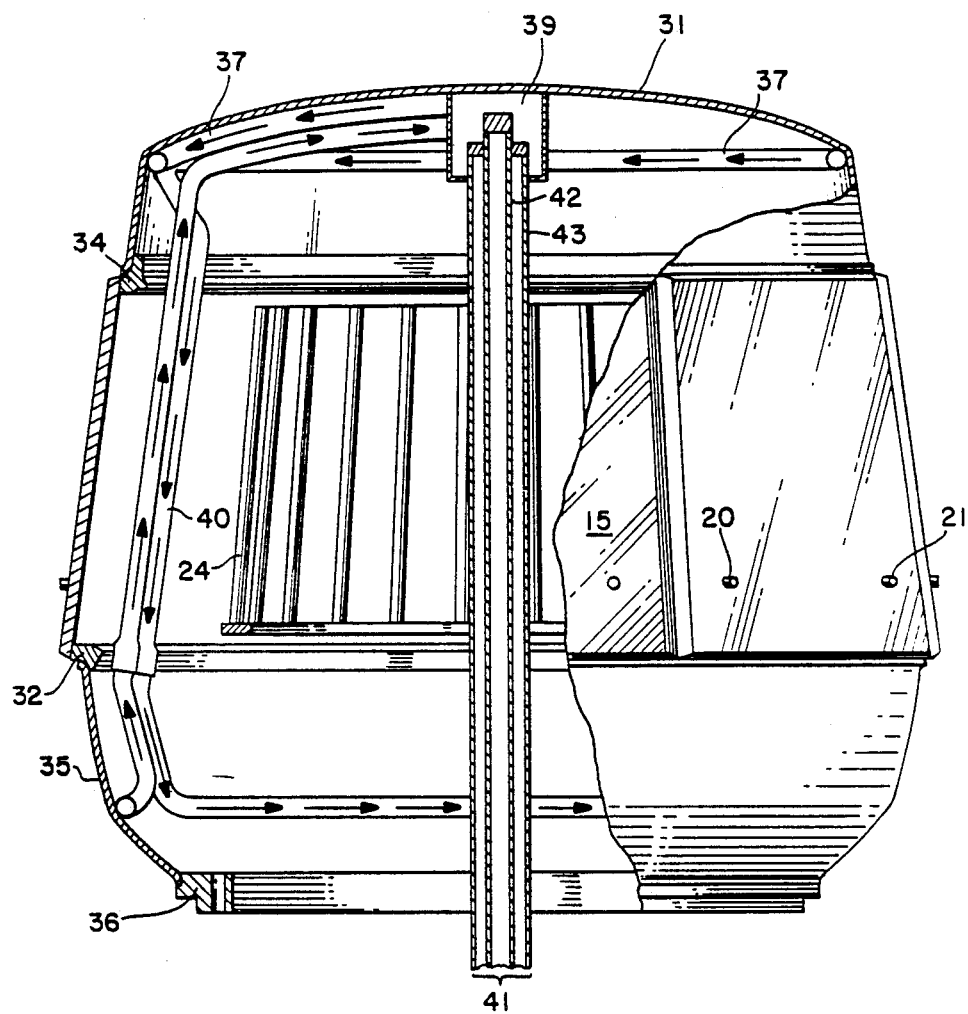
FIG. 3 shows a substrate turret assembly with a portion cut away to expose the internal construction.

Generally turret assembly 13 rests on the bottom of housing 11 on a rotating, electrically isolated vacuum seal 47. As shown from the top view in FIG. 1B, turret assembly 13 is typically octagonal in its horizontal cross-section, having a wafer platen, or chuck, such as wafer platen 15, for holding wafers on each face of the octagon. Each wafer platen is typically cut into a trapezoidal shape from ½-inch thick model sheet stock, the top of each plater being approximately 5 inches wide, the bottom being approximately 6 inches wide, and the height of the trapezoid being approximately 6 inches. As illustrated in FIG. 1B and FIG. 3 the platens are generally welded together at their edges and to a top octagon ring 34 and a bottom octagon ring 32. A cap 31 approximately 2 inches high and 10-½ inches in diameter at the top and a base 35 approximately 3 inches deep and 10-½ inches in diameter at the bottom are also welded to the top and bottom octagon rings respectively, and the entire assembly is attached to a chuck base ring 36, which, when in contact with vacuum seal 47 on the bottom of housing 11, forms a vacuum tight system. Cap 31 and base 35 are typically constructed of 1/16 inch thick monel. On the surface of each wafer platen are two pins such as pins 20 and 21, which are used to guide the wafers into position on their respective platens and to support the wafers while they are undergoing deposition.

Figure 4:
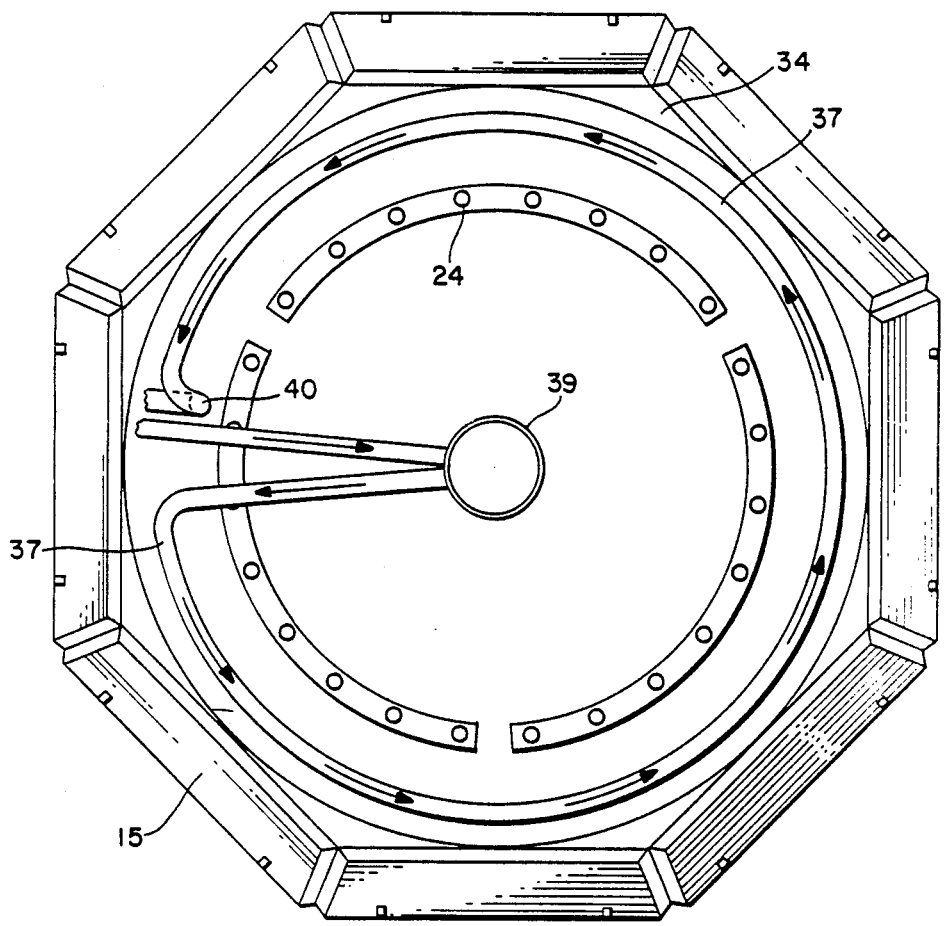
FIG. 4 is a top view of the substrate turret assembly with its cap removed to illustrate the routing of cooling pipes and to show the location of heating lamps.

During processing, turret assembly 13 can be rotated slowly by a motor 23 at constant speed typically on the order of 1 RPM, to enhance deposition uniformity. As illustrated in the cut-away views provided in FIGS. 3 and 4, turret assembly 13 is heated from the inside by a stationary array of three banks of lamps, such as lamp 24, each bank containing eight 500-watt quartz lamps controlled by solid-state rectifiers.

Typically, the entire turret assembly is constructed of monel because of its corrosion resistance and its ability to withstand high temperatures. The platens conduct heat from their back surface to their front surface where the wafers are located. Also, to ensure uniform heating of the wafer surface and to enhance absorbtion of radiation from the lamps, the inside face of the platens, next to the lamps, are coated with a layer of copper approximately ⅜ inches thick.

The temperature at the outer surface of the platens is programmable and is controlled by microprocessor 29 to be in the range of 350 degrees C.±170 degrees C., and more preferably to be 350 degrees C.±50 degrees C. Temperature information feedback to the microprocessor is provided via a stationary infrared sensor viewing the inside of the turret assembly. The rotation of turret assembly 13 allows the sensor to measure temperature throughout the assembly circumference.

To avoid deposition on areas of the turret assembly other than the platens and wafers, turret assembly 13 is typically provided with a cooling system in cap 31 and base 35. Cooling is provided by a ¼-inch water pipe 37, which substantially traverses the circumference of both the cap and base while maintaining good thermal contact therewith. Water pipe 37 is attached to a water distribution manifold 39 which is welded permanently into the cap itself. Water is supplied from a cooled water system 38 under supervision of microprocessor 29 to water distribution manifold 39 by means of a stationary double-walled pipe 41 having an inner wall 42 defining the water inlet channel and an outer wall 43 defining the water outlet channel. Typically pipe 41 extends up and inside of water distribution manifold 39, inner wall 42 extending beyond outer wall 43, with the connection between manifold 39 and pipe 41 being made water tight by means of appropriate seals. As can be seen from FIG. 3 and from FIG. 4 which corresponds to the top view of the turret assembly with cap 31 removed, water pipe 37, upon leaving manifold 39, first runs along the top of cap 31 to its periphery and makes a nearly complete circle around the periphery while in good thermal contact with cap 31. It then turns downward as indicated by pipe 40, makes a nearly complete circle around base 35, then heads back up and drains through manifold 39 into the outer portion of pipe 41. The temperature of the cap and base are maintained below about 80 degrees C., and more preferably below 60 degrees C., to avoid any significant deposition on these parts as was done for the housing walls, and to ensure that vacuum seal 47 remains cool. It should be understood, however, that the entire surface of the cap and base cannot be maintained at this latter temperature due to the temperature gradient between the heated platens and the circumferential contact of water pipe 37. Realizing that some buildup will eventually occur even on the cooled surfaces, and more importantly that the platens themselves will incur substantial deposition, a 2 kilowatt RF generator 49 has been attached to turret assembly 13 which, with addition of an etchant gas such as $NF_3$, can be used for required occasional cleaning.

In order to produce high quality films with the preferred embodiment of the apparatus, the processing steps are also specially tailored. Typically the chamber is first purged with nitrogen. Then the wafers are loaded and the housing is pumped down to a base pressure of from 10 to 20 mT. Generally, helium is started first in both the tungsten hexaflouride line 271 and the silane 251 to prevent cross contamination between gas lines and unwanted reactions therein, then the silane is begun. Typical flow rates are 100 cc/min for helium and 1000 cc/min for silane. The chamber pressure is then set to about 200 mT, and the tungsten texaflouride is turned on at a flow rate of about 14 cc/min for the desired deposition time. It is important to take precautions to avoid significant overshoot (not >20%) in the initiation of flow of the tungsten hexaflouride. (Generally the flow rate for silane should be 20 to 80 times the flow rate for the tungsten texaflouride depending on the deposition time and desired stoichiometry of the silicide and the minimum optimal flow rate for tungsten hexaflouride has been found to vary between about 1.7 to 2.0 cc/min per wafer.) At the end of the deposition, the gases are turned off in the reverse order from which they were turned on, the system is purged with nitrogen an the wafers unloaded. Typical deposition rates can be varied from about 100 to about 10,000 Angstroms/min depending on gas flows, temperature, and chamber pressure.

The resulting film quality using the above apparatus and process is excellent. Bulk resistivity is generally less than 7 micro-ohm cm then the wafers are annealed at 1000 degrees C. for 10 minutes, and less than 50 microohm cm when annealed at 1100 degrees C. for 10 minutes. Sheet resistance uniformity after anneal is typically ±5%, with run to run sheet resistance uniformity after anneal of typically ±10%. Thickness uniformity over a wafer is generally ±5%, and run to run is ±10%. The deposited surfaces are also quite smooth. In addition, the production rate is high, about 60 wafers per hour at an average film thickness of 2500 Angstroms.

One of the principal reasons for obtaining such high quality films is that the reduced temperature of the housing walls and portions of the turret assembly, together with the uniformity in gas flows which can be achieved with the mixing chambers and vacuum manifolds, enables very precise control over the deposition process, both as to stoichiometry and uniformity of deposited materials. This control is thought to be due to the fact that the deposition process is mass transport rate limited and that gas phase reactions have been eliminated. Hence, the deposition takes place nearly entirely at the hot wafer surface instead of on other parts of the system. As a result, changes in processing parameters are related very directly to changes in deposition characteristics on the wafer surface. This is very much unlike conventional hot wall systems where only a small percentage of the deposited tungsten silicides may end up on the wafer surface, so that often much larger changes are required in processing parameters to achieve smaller changes in deposition characteristics, and even those changes are often not readily predictable. Also, generally, hot wall systems have poor mass transport control, so that reactant gas ratios from wafer to wafer in each load can be quite varied. In addition, gas phase reactions are more likely to occur and can cause increased defect density. An advantage of the present invention is that it virtually eliminates wafer contamination by particulates which arise from excessive build up of deposited materials on surfaces other than the wafers. Furthermore, the system is very efficient in its use of these expensive reactant gases, since virtually all of the deposited materials end up on the surface of the wafers instead of elsewhere.

Another advantage of the present system is that the tungsten silicide films produced tend to be silicon rich, rather than tungsten rich as in some of the prior art processes. Resulting films can typically be represented as $WSi_x$, where x can be varied between about 2.0 and 4.0, with the optimum between 2.4 and 2.7. Although the precise mechanism to achieve this result is not well understood, a general concept can be developed by noting the various chemical reactions which are thought to occur at the substrate surface:

1. $2WF_6 + 3Si \rightarrow 2W + 3SiF_4$
2. $SiH_4 \rightarrow Si + 2H_2$
3. $WF_6 - Si_2H_6 \rightarrow WSi_2 + 6HF$
4. $WF_6 + 3H_2 \rightarrow W + 6HF$
5. $WF_6 + 6SiH_4 \rightarrow W + 3Si_2H_6 + 6HF$
6. $Si_2H_6 \rightarrow 2Si + 3H_2$ Based on these equations, and knowing that the decomposition of silane at low pressure typically occurs at temperatures in excess of about 550 degrees C., a much higher temperature than that used in the present system, it is thought that there must be a significant occurrance of surface catalyzed decomposition of silane.

Those skilled in the art will understand that while the above device has been characterized in regard to the deposition of tungsten silicides, its use is equally applicable to deposition of other materials as well, and is especially well suited to situations where mass transport control is desired, for example, for some refractory metals and refractory metal silicides. Of course, the precise range of cooling temperatures for the housing and turret will change, as will the flow rates and gas compositions depending on the desired deposition materials. Furthermore, it should be understood that monel and aluminum were chosen as the materials of construction for their thermal conductivity, their resistance to corrosion, and for their ease in fabrication. Other materials could also be used depending on the particular process and materials to be deposited. In addition, although the figures above regarding film quality and reproducibility pertain to deposition on a silicon substrate, it should be apparent that nearly any material could be used as a substrate for deposition as long as it can withstand the required temperatures. Some particularly useful substrate materials are various oxides, poly-Si, gallium arsenide, dielectrics and metals. Also, it should be apparent that the invention is not limited to an octagonal structure. For example, the invention applies equally well to a substrate turre assembly having n-fold symmetry, where n is the number of platens. Those skilled in the art will also realize that there are many other gas mixing/diffusing geometries and systems which can be used to achieve an even distribution of reactant gas at the wafer surfaces. For example, one could use a single mixing chamber which encircled the entire housing, with either a continuous orifice or a plurality of orifices around the perimeter of the housing.

What is claimed is:

1. In a low pressure chemical vapor deposition reactor having a vacuum housing and a mixing chamber, a method of depositing tungsten silicide on a substrate or a plurality of substrates comprising the steps of:

evacuating said vacuum housing;

providing a flow of silane and tungsten hexafluoride into the mixing chamber, the flow rate of silane being greater than 20 times the flow rate of tungsten hexafluoride, said mixing chamber connected to said vacuum housing for introducing silane and tungsten hexafluoride as mixed gases into said vacuum housing;

heating said substrate or plurality of substrates to cause deposition of tungsten silicide on said substrate or plurality of substrates; and actively cooling the vacuum housing to a temperature of below 60° C. to decrease the deposition of tungsten silicate on said housing.

* * * * *